July 4, 1961 E. R. KULKA 2,991,440

SCREW-TYPE TERMINAL CONNECTOR FOR PRINTED CIRCUITS

Filed March 26, 1958 2 Sheets-Sheet 1

INVENTOR.
EUGENE R. KULKA

BY Amster & Levy
ATTORNEYS

July 4, 1961 E. R. KULKA 2,991,440

SCREW-TYPE TERMINAL CONNECTOR FOR PRINTED CIRCUITS

Filed March 26, 1958 2 Sheets-Sheet 2

INVENTOR.
EUGENE R. KULKA
BY
Amster & Levy
ATTORNEYS

United States Patent Office 2,991,440
Patented July 4, 1961

2,991,440

SCREW-TYPE TERMINAL CONNECTOR FOR PRINTED CIRCUITS

Eugene R. Kulka, Mount Vernon, N.Y., assignor to Kulka Electric Corp., Mount Vernon, N.Y., a corporation of New York Filed Mar. 26, 1958, Ser. No. 724,015
5 Claims. (Cl. 339—17)

This invention relates to improvements in printed circuit assemblies, and in particular to new and improved connector means for the attachment of external wiring to printed circuit boards.

As is well known, printed circuit units conventionally consist of a conductive pattern formed on a base plate or panel of insulating material by chemical or vapor deposition, etching, plating or the like. Component parts of the circuit may be printed within the conductive pattern as an integral portion thereof, or may be made as separate units and electrically connected to the printed circuit board. In addition, external wiring must usually be employed to connect the printed circuit board to associated circuitry, external energization sources, units to be controlled by the printed circuit, and the like. For the latter purpose, it is the usual practice to design the printed circuit board so that the printed conductive leads of the various circuitry portions are run toward a common edge of the base plate, and a connector unit is employed to provide a terminal for each of the printed conductive leads to which terminal an external lead may be attached. Since printed circuit boards are usually made as small as possible, the printed conductive leads are invariably spaced from each other by a very small distance, which makes the attachment of external wires thereto a difficult, cumbersome, and expensive operation. Because of the very close spacing, the use of terminal screws for attachment of the external wiring has not hitherto been attempted, and all printed circuit connectors are conventionally provided with either soldering terminals or tapered pin type plug and socket assemblies. Such tapered plug and socket assemblies are expensive to manufacture and do not provide a secure wire attachment in all applications. The use of connectors having soldering terminals has also proved disadvantageous because of the extremely close spacing, shorting of the terminals often resulting from contacting of the soldering points and flux creepage. In addition, it will be obvious that the soldering of wires to a series of closely-spaced lugs is a difficult and expensive manufacturing procedure.

Conventional printed circuit connector units are normally provided with one of two types of connections to the printed circuit board. In one type, a plurality of terminal pins are provided to fit within connector mounting holes in the printed circuit board. In the other type, spring contacts are used to embrace the edge of the board and make contact with the printed conductor lead. In both types, the connector unit is often made in the form of a plug to which a socket unit is attached, the socket unit carrying the soldering lugs to which the external wiring is attached. Such plug and socket assemblies are expensive to manufacture and require that the plug unit be physically secured to the printed circuit board as by bolts or the like. The assemblies have the advantage, however, of permitting the external wiring to be changed or replaced without interfering with the soldering on the printed circuit board.

According to the present invention there is provided a connector for a printed circuit board in which the conventional soldering of external lead wires is completely eliminated. The connector is made in the form of a miniature terminal block having screw connections for the attachment of the external wiring. The screw connections are made integral with terminal pins which are arranged for insertion into standard connector mounting holes of the printed circuit board and the entire connector unit is securely mounted on the board by the relatively economical manufacturing procedure of dip soldering the pins within the connector mounting holes.

It is an object of the invention to provide a printed circuit connector of the character described in which the screw connections permit the external wiring to be easily changed, replaced or serviced without the necessity of applying heat for removing soldering and without the necessity of providing the usual bulky pin and socket type of connector unit which must be screw-mounted on the printed circuit board.

Another object of the invention is the provision of a printed circuit connector which may be initially manufactured in a size sufficient to accommodate the largest number of connector mounting holes which may be employed in a standard printed circuit board, and which may be easily and conveniently cut down in size to fit other printed circuits having a lesser number of circuit-mounting holes.

Additional objects and advantages of the invention will be apparent during the course of the following specification when taken in connection with the accompanying drawings, in which.

Figures 4, 5, 6, 7:
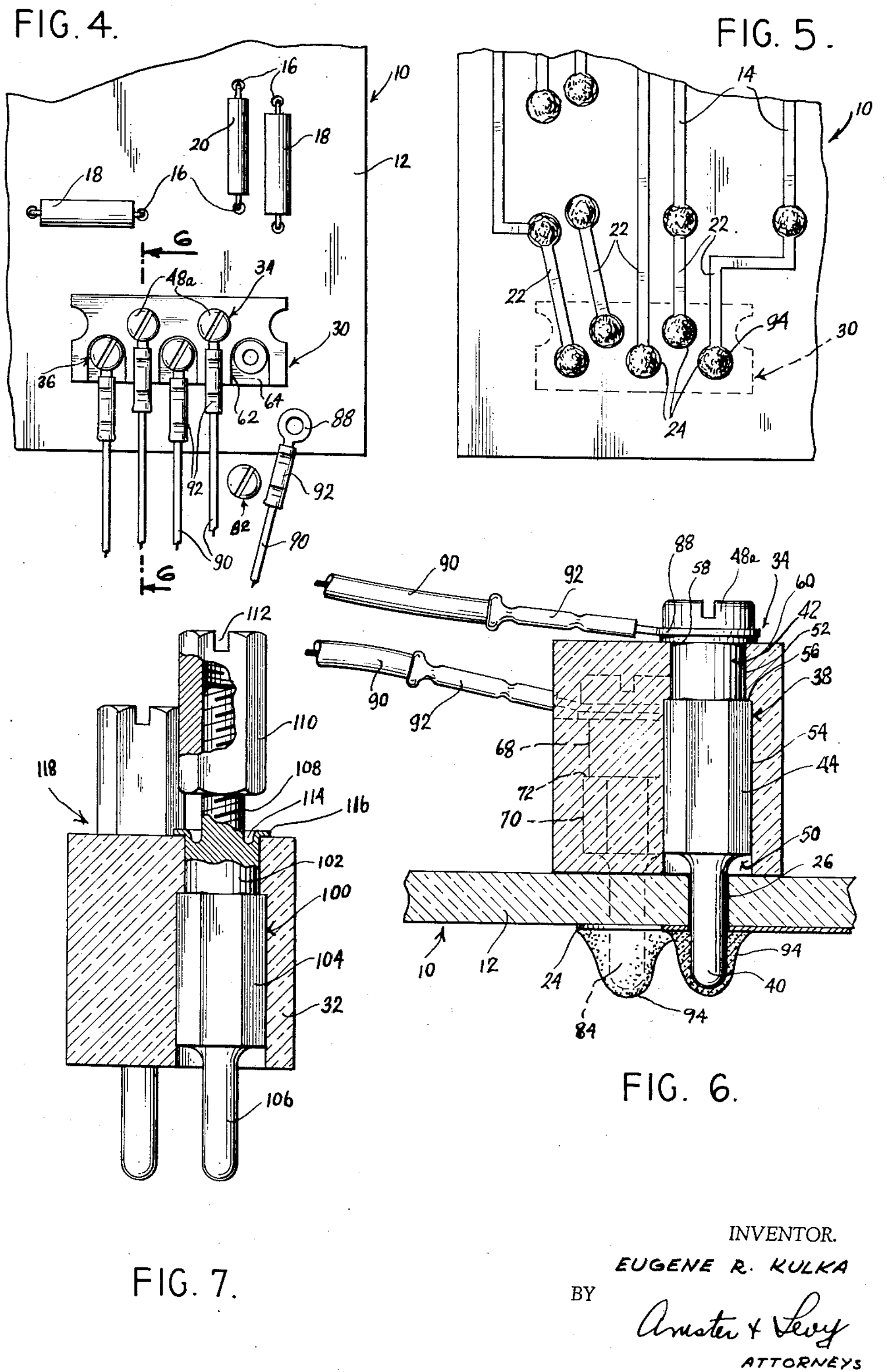
FIG. 4 is a top plan view of a printed circuit board showing the connector unit mounted thereon, and external wiring attached thereto.
FIG. 5 is a bottom plan view of the printed circuit board shown in FIG. 4.
FIG. 6 is an enlarged section taken along line 6—6 of FIG. 4.
FIG. 7 is a sectional view similar to FIG. 6, but showing a modified type of screw connection in which a nut is threaded upon an upstanding threaded post.

Referring in detail to the drawings, there is shown in FIGS. 4 and 5 a printed circuit board designated generally by the reference numeral 10 and comprising a base plate 12 having a printed circuit 14 formed on one surface thereof. The base plate 12 is made of an insulating material and is formed in the usual manner with a series of component mounting holes 16 by which separable component parts such as the condensors 18 and resistor 20 may be mounted in the printed circuit.

The printed circuit board 10 is designated in the usual manner with its circuitry terminating in a series of spaced, printed conductor strips 22, each having a terminal area 24 surrounding a connector mounting hole 26. The mounting holes 26 are adapted to receive contact pins of a connector unit to which wiring may be attached, and for this purpose, printed circuit boards are usually manufactured with from two to twenty-three of the connector mounting holes. Such mounting holes are usually arranged in standardized patterns in a double row with the mounting holes of one row spaced from or staggered with relation to the holes of the other row.

Figure 3:
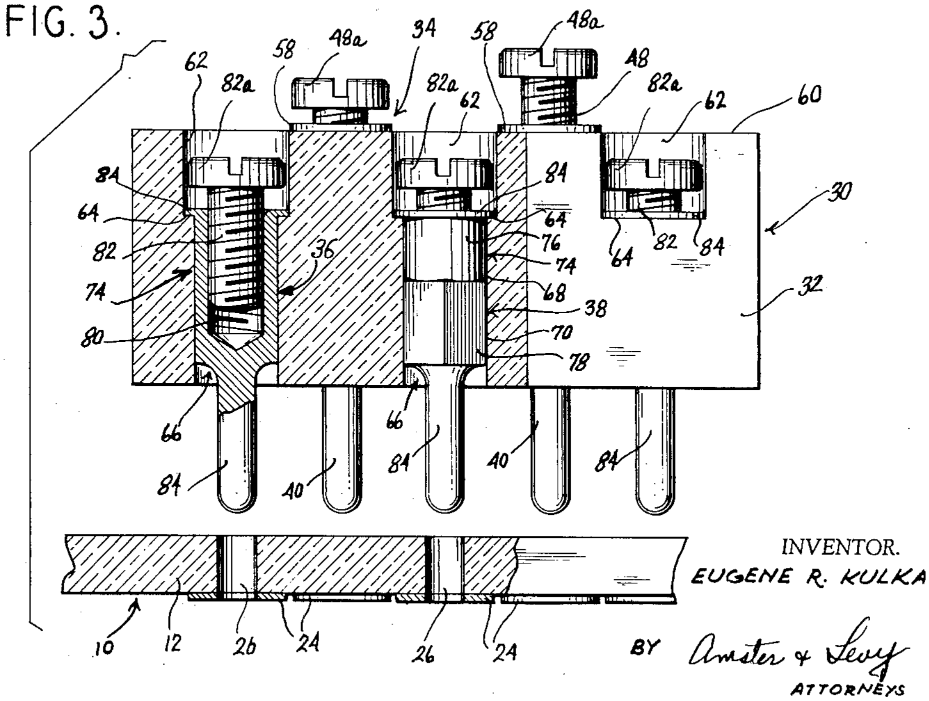
FIG. 3 is a section taken substantially along line 3—3 of FIG. 1 with the center terminal member shown in elevation to reveal its external construction, and also showing a portion of a printed circuit board partially broken away to reveal the connector mounting holes and the manner in which the connector terminal pins are inserted therein.

For attaching wiring to a printed circuit board of this type having connector mounting holes, conventional connectors are made with contact pins sized and arranged to fit within the holes. For convenience of illustration, and by way of example, the printed circuit board 10 shown in FIG. 5 is shown as having five printed conductor strips 22, each having a terminal area 24, and each terminal area containing a central connector mounting hole 26, as shown in FIGS. 3 and 6. Since there are thus five connector mounting holes 26 arranged in two rows, the connector unit of the invention will require five matching contact pins to fit within the holes.

Figure 1:
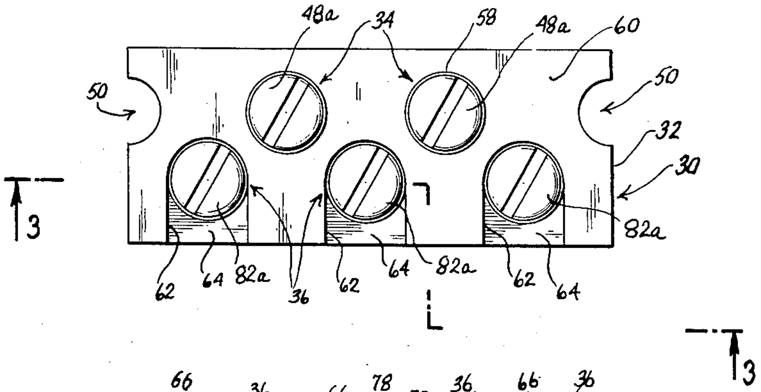
FIG. 1 is a top plan view of a connector unit made in accordance with the invention.

The connector unit 30 of the present invention is intended to provide an electrical connection between the printed wiring strips 22 and external connecting wiring. Said connector unit 30 comprises a body portion in the form of an elongated block 32 molded of insulating material. A plurality of terminal members generally indicated as 34 and 36 are mounted in the block 32 in two rows, as shown in FIG. 1. Each of said terminal members is made of a conductive metal and carries a contact pin for insertion into the connector mounting holes of the printed circuit board, and therefore the terminal members are arranged in two rows and in staggered relationship, in the same manner as the connector mounting holes.

Figure 2:
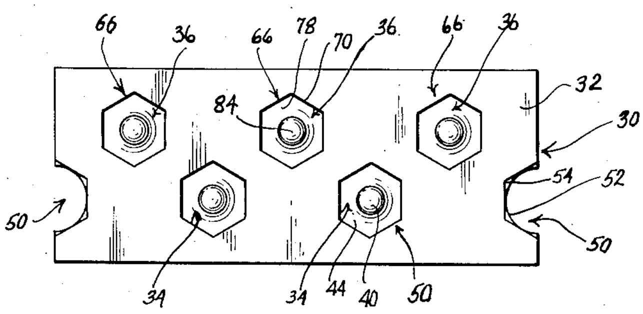
FIG. 2 is a bottom plan view thereof.

Each terminal member 34, as shown in FIG. 6, includes a conductive metal body 38 formed with an integral depending contact pin 40. The body 38 has an upper portion 42 of circular cross-section and a lower portion 44 of lesser area and of a non-circular cross-section, preferably of a hexagonal cross-section, as shown in FIG. 2. The body 38 is formed with an axially-extending threaded bore which extends downwardly from the top surface of said body, and is sized to receive and retain the threaded shank of a terminal screw 48 having a slotted head **48*a***.

For receiving and mounting the terminal members 34, the connector unit block 32 is provided with a longitudinal row of spaced bores 50. In the illustrated embodiment, the block 32 shown in FIGS. 1 and 2 has two usable bores 50 in the row, and the block is cut at its ends through two of the bores 50 at each end of the row. As can be best seen in FIG. 6, each bore 50 has an upper bore portion 52 of circular cross-section and a lower bore portion 54 of hexagonal cross-section conforming in size respectively to the circular upper portion 42 and the hexagonal lower portion 44 of the terminal member body 38. A shoulder 56 is formed between the upper and lower bore portions 52 and 54.

In mounting the terminal members 34, each body portion 38 is inserted upwardly through the bottom open end of a respective bore 50 until the hexagonal lower portion 44 of the terminal member body is stopped from further upward movement by engagement with the shoulder 56. A flange 58 at the upper end of the terminal member body portion 38 is then peened over to overlie the top surface 60 of the connector unit block 32 whereby the body portion 38 is secured in mounted position within the bore 50. In this mounted position shown in FIG. 6, the top open end of the threaded bore 46 is substantially flush with the top surface 60 of the base 32 and the contact pin 40 projects well below the bottom surface of the block 32. The hexagonal lower portion 44 of the terminal member body portion 38 is received within the hexagonal lower bore portion 54 and is restrained thereby against turning movement when the srew 48 is inserted.

The terminal members 36 are arranged in a second longitudinal row, there being three such terminal members in the row. As shown in FIG. 1, the terminal members 36 are staggered with relation to the terminal members 34 so that each terminal member 36 is located midway between a pair of the terminal members 34. The connector block 32 is so formed that in addition to being staggered, the upper ends of the terminal members 36 are located on a level which is lower than the level upon which the upper ends of the terminal members 34 are located. For this purpose, the connector body 32 is formed with a series of recesses 62 extending downwardly from the top surface 60 of the connector body and also opening through the front surface of the connector body, as shown in FIGS. 1 and 3. The recesses 62 have planar bottom surfaces 64. The top open end of a bore 66 is centered in each of the recesses 62, each of the bores 66 having a cylindrical upper bore portion 68 and a hexagonal lower bore portion 70 of greater cross-sectional area, and forming a shoulder 72 therebetween, as indicated in FIG. 6.

The terminal members 36 are similar in construction to the terminal members 34, except that their metal body portions 74 are shorter to conform in size to the shorter bores 66. Each terminal member body 74 has an upper portion 76 of circular cross-section and a lower portion 78 of hexagonal cross-section for respective reception in the bore portions 68 and 70, as is clearly illustrated in FIG. 3. At the upper end of each terminal member 36, a threaded bore 80 is provided for receiving the threaded shank of a terminal screw 82 having a slotted head **82*a*. A flange 84 is also formed on the upper end of each terminal member 36 and is spun over or peened oover the planar bottom surface 64 of the respective recess 62 for mounting the terminal members 36 securely in the bore 66. The terminal members 36 also have integral contact pins 84 which project out of the bores 66 and extend below the bottom surface of the connector body 32**.

Each terminal member 34 and 36 is adapted to receive the terminal lug 88 of a lead wire 90. As shown in FIG. 4, each terminal lug 88 is in the form of an eyelet joined to the lead wire 90 by a crimped metallic sleeve 92. The lugs 88 are clamped by the screw heads **48*a* and 82*a* against the top surfaces of the terminal members 34 and 36** to provide good electrical contact therewith.

In actual practice, in commercial printed circuit boards, the standard lateral distance between centers of the connector mounting holes in one row and the connector mounting holes of the other row is ⅛ inch. The longitudinal distance between the holes in one row is 5/32 inch. When the terminal screws 48 and 82 are tightened, the terminal lugs are compressed by the screw heads **48*a* and 82*a*, and expand. Because of the very small distances between the terminal members, the expanded terminal lugs or their crimped sleeves would normally tend to contact each other, causing possible shorts in the circuitry. The spacing between the terminal members is too small to permit the molding of barriers or partition separators. Consequently, in accordance with the invention, separation of the terminals is effected by placing the two rows on different levels. Thus the terminal lugs 88 of the wires 90 mounted on the terminal members 34 are located at the level of the upper surface 60 of the block 30, while the terminal lugs of the wires mounted on the terminal members 36 are located at a lower level, namely at the level of the bottom surfaces 64 of the recesses 62**.

After the separable component parts 18 and 20 and the connector unit 30 are inserted in the base plate 12, the pig tail leads of the component parts and the contact pins 40 and 84 of the connector unit are secured to the base plate 12 by simultaneous dip soldering. This forms drops of solder 94 which secures the contact pins 40 and 84 to the respective terminal areas 24 of the printed conductor strips 22, as shown in FIGS. 5 and 6.

In practice, the block 30 may be made in the longest length which may be required for a printed circuit board. At the present time, printed circuit boards normally have a maximum of twenty-three connector mounting holes, and consequently, the block is made with twenty-three bores 50 and 66. The block may then be cut down as required when used for smaller printed circuit boards having a lesser number of connector mounting holes. As an example of how this may be done, the block 30 shown in FIGS. 1 and 2 has been cut down to provide five usable bores 50 and 62.

FIG. 7 shows a modified type of terminal member 100 which may be used in the block 32. The terminal member 100 has a body portion formed of a cylindrical upper portion 102 and a hexagonal lower portion 104 with an integral contact pin 106, in the same manner as the terminal members shown in FIGS. 1 to 6. At its upper end, however, the terminal member 100 has an integral upstanding threaded post 108 upon which is received a terminal nut 110, having a slot or kerf 112 in its upper surface for receiving the blade of a screwdriver. A circular groove 114 is cut around the base of the post 108, forming a flange 116 which is peened over the upper surface of the block 32 to secure the terminal member 100 in position. As is indicated in FIG. 7, the terminal members 100 are mounted in a row with their upper ends at the level of the top of the block 32. Again, smaller terminal members 118 of the same type are mounted in a second row at a lower level provided by the block recesses 62.

While preferred embodiments of the invention have been shown and described herein, it is obvious that numerous additions, changes and omissions may be made without departing from the spirit and scope of the invention.

What is claimed is:

1. A connector unit for attaching external lead wires to a printed circuit board having a plurality of printed conductor strips including terminal areas and a connector mounting hole located in each terminal area, said mounting holes being arranged in two rows with the holes of one row staggered with relation to the other row; said connector unit comprising a body of insulating material having a row of recesses therein and two rows of through bores, the bores in one of said rows being located in said row of recesses, each of said bores having an upper portion of circular cross-section and a lower portion of non-circular cross-section, and a plurality of terminal members mounted in the respective bores, each terminal member comprising a body portion having an upper end of circular cross-section and a lower end of non-circular cross-section fitting within the respective upper and lower portions of one of said bores, a contact pin integral with the lower body portion and extending below the bottom surface of the block body in position for insertion into one of the connector mounting holes of the printed circuit board, a threaded portion at the upper end of the terminal member, and a threaded terminal piece engageable with said threaded portion for clamping one of the external lead wires to the terminal member, the threaded portions of the terminal members of one row being located at a different level from the threaded portions of the terminal members of the other row, whereby the external lead wires are clamped to the terminal members at different levels.

2. A connector unit according to claim 1 in which the upper circular portion of each bore is of lesser cross-sectional area than the lower non-circular portion and forms a shoulder therebetween, each terminal member having an upper flange extendable over the adjacent surface of the body for immovably mounting the terminal member between said adjacent surface and said shoulder.

3. A connector unit according to claim 1 in which the threaded portion at the upper end of each terminal member comprises a threaded bore and the threaded terminal piece comprises a terminal screw receivable in said threaded bore.

4. A connector unit according to claim 1 in which the threaded portion at the upper end of each terminal member comprises an upstanding threaded post and the threaded terminal piece comprises a terminal nut turnably mounted on said post.

5. A connector unit for attaching external lead wires to a printed circuit board having a plurality of printed conductor strips including terminal areas and a connector mounting hole located in each terminal area, said mounting holes being arranged in two rows with the holes of one row staggered with relation to the other row; said connector unit comprising a body of insulating material having a row of recesses therein and two rows of through bores, the bores in one of said rows being located in said row of recesses, each of said bores having an upper portion of circular cross-section and a lower portion of hexagonal cross-section, and a plurality of terminal members mounted in the respective bores, each terminal member comprising a body portion having an upper end of circular cross-section and a lower end of hexagonal cross-section fitting within the respective upper and lower portions of a bore, a contact pin integral with the lower body portion and extending below the bottom surface of the block body in position for insertion into one of the connector mounting holes of the printed circuit board, a threaded portion at the upper end of the terminal member, and a threaded terminal piece engageable with said threaded portion for clamping one of the external lead wires to a clamping portion of said terminal member, the clamping portions of the terminal members of one row being located at the level of the top surface of the connector unit body, the clamping portions of the terminal members of the other row being located at the level of the bottom surfaces of the recesses, whereby the external lead wires are clamped to the connector unit at different levels.

References Cited in the file of this patent

UNITED STATES PATENTS

| | | |
|---|---|---|
| 778,681 | Krantz et al. | Dec. 27, 1904 |
| 2,089,844 | Anderson | Aug. 10, 1937 |
| 2,090,860 | Bonat | Aug. 24, 1937 |
| 2,593,479 | Nieter | Apr. 22, 1952 |
| 2,766,436 | Luebking | Oct. 9, 1956 |
| 2,836,640 | Mueller | May 27, 1958 |
| 2,840,793 | Sunko et al. | June 24, 1958 |

FOREIGN PATENTS

| | | |
|---|---|---|
| 684,915 | Great Britain | Dec. 24, 1952 |

OTHER REFERENCES

I.H. "Electronic Equipment," January 1956, page 84.